(12) United States Patent
Khan et al.

(10) Patent No.: US 8,125,579 B2
(45) Date of Patent: Feb. 28, 2012

(54) POLARIZED LIGHT EMITTING DIODE AND USE THEREOF

(75) Inventors: Sajjad A. Khan, Plano, TX (US); Steven M. Penn, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 764 days.

(21) Appl. No.: 11/959,678

(22) Filed: Dec. 19, 2007

(65) Prior Publication Data

US 2009/0161040 A1 Jun. 25, 2009

(51) Int. Cl.
*G02F 1/1335* (2006.01)
*H01L 33/00* (2010.01)
(52) U.S. Cl. .................. 349/5; 349/69; 257/98
(58) Field of Classification Search .................. None
See application file for complete search history.

(56) References Cited

U.S. PATENT DOCUMENTS

| | | | |
|---|---|---|---|
| 6,841,803 B2* | 1/2005 | Aizawa et al. | 257/98 |
| 6,940,801 B1* | 9/2005 | Ishii et al. | 369/112.01 |
| 7,537,352 B2* | 5/2009 | Chen | 362/19 |
| 2006/0066192 A1* | 3/2006 | Beeson et al. | 313/112 |
| 2006/0091412 A1* | 5/2006 | Wheatley et al. | 257/98 |
| 2006/0284206 A1* | 12/2006 | Masui et al. | 257/98 |
| 2007/0211449 A1* | 9/2007 | Holman et al. | 362/19 |
| 2008/0008424 A1* | 1/2008 | Shimizu | 385/51 |
| 2008/0054283 A1* | 3/2008 | Min et al. | 257/98 |
| 2008/0074723 A1* | 3/2008 | Park et al. | 359/254 |
| 2010/0084671 A1* | 4/2010 | Xu et al. | 257/98 |

* cited by examiner

*Primary Examiner* — Michelle R Connelly Cushwa
(74) *Attorney, Agent, or Firm* — Warren L. Franz; Wade J. Brady, III; Frederick J. Telecky, Jr.

(57) ABSTRACT

Provided is a light emitting diode (LED). The LED, in one embodiment, includes a reflective layer located over a substrate and a quarter wave plate emitter layer located over the reflective layer. The quarter wave plate emitter layer, in this embodiment, is substantially crystalline in nature, and further wherein an extra-ordinary axis of the quarter wave plate emitter layer is located in a plane thereof. The LED, in this embodiment, further includes a transmissive/reflective polarization layer located over the quarter wave plate emitter layer, wherein a transmission direction of the transmissive/reflective polarization layer is oriented at about 45 degrees with respect to the extra-ordinary axis.

15 Claims, 4 Drawing Sheets

POLARIZED LIGHT EMITTING DIODE AND USE THEREOF

TECHNICAL FIELD

The disclosure is directed, in general, to a light emitting diode (LED) and, more specifically, to a polarized LED.

BACKGROUND

There is presently a desire to provide the most exciting viewing experience possible to users of today's video display systems. One technology known to provide an enhanced viewing experience includes the projection of three dimensional (3-D) images. In the projection of 3-D images, two component images of a single three dimension image are time-sequentially displayed on a single display plane. Each of these images is taken from a slightly different perspective. These two component images are called the Right eye sub-frame and the Left eye sub-frame. As is evident from their name, each of these sub-frames is meant for only one eye of the viewer. Hence, means are provided to allow only one eye of the viewer to see the appropriate sub-frame at a time. One such means is a pair of 3-D glasses, which cancels out one of the two sub-frames per eye, thus seeing a single 3-D image on the display plane.

Systems currently configured to project the 3-D images have certain inherent problems. Image brightness is one such inherent problem. For example, because an initially unpolarized light beam (e.g., provided from a broad band lamp source, a light emitting diode (LED) source(s), etc.) is converted to a polarized light beam with orthogonal polarizations at a location proximate the viewer (e.g., often using the 3-D glasses), at least about 50% of the brightness of the initial unpolarized light beam is automatically lost.

What is needed is a device or system that addresses the loss of brightness experienced in the prior art.

SUMMARY

To address the above-discussed deficiencies of the prior art, provided is a light emitting diode (LED). The LED, in one embodiment, includes a reflective layer located over a substrate and a quarter wave plate emitter layer located over the reflective layer. The quarter wave plate emitter layer, in this embodiment, is substantially crystalline in nature, and further has an extra-ordinary axis that is located in a plane thereof. The LED, in this embodiment, further includes a transmissive/reflective polarization layer located over the quarter wave plate emitter layer. In this embodiment, a transmission direction of the transmissive/reflective polarization layer is oriented at about 45 degrees with respect to the extra-ordinary axis of the quarter wave plate emitter layer.

Further provided is a method for manufacturing an LED. The method of manufacture, without limitation, includes forming a reflective layer over a substrate and forming a quarter wave plate emitter layer having a thickness (t) over the reflective layer. In this embodiment, the thickness (t) is chosen based upon a birefringence of the quarter wave plate emitter layer and a given wavelength of light to be emitted there from. Moreover, an extra-ordinary axis of the quarter wave plate emitter layer is located in a plane thereof. The method of manufacture may further include forming a transmissive/reflective polarization layer over the quarter wave plate emitter layer. A transmission direction of the transmissive/reflective polarization layer, in this embodiment, is oriented at about 45 degrees with respect to the extra-ordinary axis of the quarter wave plate emitter layer.

Additionally provided is a display system. The display system, in accordance with one embodiment, includes a polarized LED configured to provide illumination. The polarized LED may be similar to the LED discussed in the preceding paragraphs. The display system, in this embodiment, may further include a spatial light modulator configured to receive the illumination and display an image.

BRIEF DESCRIPTION OF THE DRAWINGS

For a more complete understanding of the disclosure, reference is now made to the following descriptions taken in conjunction with the accompanying drawings, in which.

DETAILED DESCRIPTION

The present disclosure is based, at least in part, on the acknowledgement that approximately 50% of the brightness of a non polarized illumination source is lost when converted from a non polarized state to a polarized state, such as might be required in many display systems (e.g., Liquid Crystal Displays (LCD), Liquid Crystal on Silicon (LCoS) projection displays, etc.) 3-D displays that use polarized Liquid Crystal (LC) based goggles for shuttering of the left/right sub-frame can also benefit from such polarized sources. The present disclosure further acknowledges that an additional approximately 25% of the brightness is lost when active shutters (e.g., 3-D goggles having actively switchable polarization states) are used or required with the display system configured to display the 3-D images. This loss varies depending upon the LC shutter finite rise and fall times. During the finite rise and fall times (e.g., the shutter transition from open(close) to close(open) state) the image source has to be turned off so as to prevent the loss of shutter contrast. Accordingly, in those applications wherein an un-polarized illumination source is initially used to display a 3-D image, and further wherein active shutter goggles are required or used, depending upon the optical system efficiency, a fraction of the 25% (or less) of the original brightness ultimately makes it to the intended viewer. This number, however, does not even include optical losses as the light beam passes through the different optical components inside the display, such as the illumination optics, color filters, integrators and homogenizers, spatial light modulator(s) projection optics and the viewing screen. Accordingly, if these are taken into account then only a few percent of the light from the light source would generally make it to the viewer's eye.

Based upon the aforementioned acknowledgments, as well as substantial experimentation, the disclosure recognizes that polarized light emitting diodes (LEDs) may be used to significantly increase the amount of the original brightness that ultimately makes it to the intended viewer. For instance, because the un-polarized to polarized conversion is accomplished at the LED level, as opposed to later in the process, the 50% of brightness traditionally lost (as discussed above) is significantly reduced. Additionally, in those instances wherein the polarization of the polarized LED illumination source may be actively switched, passive shutter goggles, as opposed to the active shutter goggles, may be used. Accordingly, the 25% of brightness traditionally lost (as discussed above) is also substantially reduced. Accordingly, in those instances wherein actively switchable polarized LED illumination sources are used in a display system, a greater portion of the original brightness of the LED illumination sources makes it to the intended viewer. If two orthogonally polarized LEDs are optically combined, as later described in this disclosure, and time sequentially turned on for the left/right 3D sub-frames appropriately, then, accordingly, with the use of passively polarized goggles, the 25% of brightness traditionally lost (as discussed above) is mostly recovered.

The disclosure further recognizes that the polarized LEDs are particularly useful in Digital Micromirror Device (DMD) projection devices, liquid crystal on silicon (LCoS) projection devices, High Temperature Poly-Silicon (HTPS) projection devices, and liquid crystal display (LCD) projection devices, among others. In such applications, an absorptive sheet polarizer, when properly oriented, may be used proximate the display screen to significantly improve (e.g., up to at least two fold) ambient light rejection. In the case of the DMD based projection display, the absorptive sheet polarizer's transmission axis may be aligned with the polarization direction of the Polarized LED source. In the case of the LCD based displays (both projection and direct view type), the absorptive sheet polarizer's transmission axis may be aligned with a transmission axis of the output analyzer that is used with the LCDs. Accordingly, greatly improved contrast ratios may be achieved, for example due to the reduction in ambient light bouncing off the viewing screen since the absorptive sheet polarizer absorbs approximately half of the un-polarized ambient light.

The disclosure further recognizes that the polarized LEDs are useful in direct view LCD devices (e.g., flat panel LCDS). For instance, the polarized LEDs, or single polarized LED depending on the embodiment, may be used to provide backlighting for the direct view LCD devices. In those embodiments wherein the polarized LEDs are used, traditional polarization recycling films (e.g., often provided by 3M) may be eliminated. This will enable flat panel LCDs with improved optical system efficiencies, lower losses and reduced power consumption. Furthermore, LED(s) with two orthogonal polarizations can be used to present 3-D views by appropriately using one polarization state for one eye along with associated polarized glasses worn by the viewer.

Figure 1A:
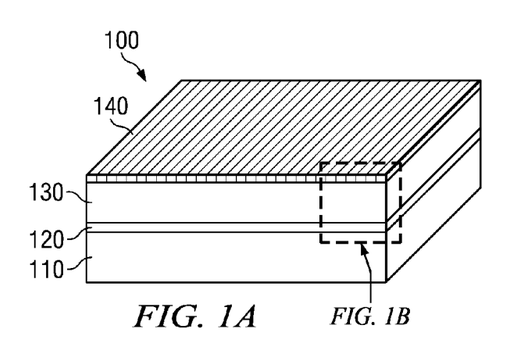
FIG. 1A illustrates an LED manufactured in accordance with the disclosure.

FIG. 1A illustrates an LED 100 manufactured in accordance with the disclosure. The LED 100 of FIG. 1A initially includes a substrate 110. The substrate 110 may comprise various different materials. For example, the substrate 110 may comprise any material capable of providing a mountable surface for the other layers of the LED 100. In one example embodiment, the substrate 110 comprises silicon. In yet other example embodiments, the substrate 110 comprises AlInGaP, or another similar semiconductor material with varied compositions.

Located over the substrate 110 in the embodiment of FIG. 1A is a reflective layer 120. The reflective layer 120, in the given embodiment, has a high reflectivity for all polarization states. Accordingly, the reflective layer 120 may be used to return any light rays originally reflected by the transmissive/reflective polarization layer 140 located thereover.

The reflective layer 120 may comprise various materials and remain within the purview of the disclosure. In one embodiment, the reflective layer 120 comprises a multilayer interference mirror stack. In yet another embodiment, the reflective layer 120 comprises a metal coating. For example, the metal coating might comprise aluminum, silver, gold, or other reflective metals, as well as alloys thereof.

In those embodiments wherein the reflective layer 120 comprises a conductive material, such as the metal coating, the reflective layer 120 can function as a dual purpose reflective layer/electrode layer. Accordingly, the reflective layer 120, in one example embodiment, also functions as the electrode for the LED 100. In those embodiments wherein the reflective layer 120 is not configured to function as the electrode layer, a separate electrode layer could be appropriately located within the LED 100.

Positioned over the reflective layer 120 is a quarter wave plate emitter layer 130. The term "quarter wave plate emitter layer", as used throughout this disclosure, means a layer of material that includes both photon emissive properties, such as in an active LED emitter layer, as well as has polarization changing properties, such as in a quarter wave plate. This definition, however, does not include an active emitter layer having a separate quarter wave plate layer located thereunder or thereover, wherein the separate quarter wave plate layer is configured to change the polarization state of rays of light passing therethrough.

The quarter wave plate emitter layer 130 may comprise various different materials, for example materials that are substantially crystalline in nature and are birefringent at the wavelength of light to be emitted by them. In many embodiments, the quarter wave plate emitter layer 130 comprises inorganic semiconductor materials. For example, among others, the quarter wave plate emitter layer 130 might comprise aluminum gallium arsenide (AlGaAs), aluminum gallium phosphide (AlGaP), aluminum indium gallium phosphide (AlInGaP), gallium arsenide phosphide (GaAsP), gallium phosphide (GaP), gallium nitride (GaN), indium gallium nitride (InGaN), silicon carbide (SiC), sapphire ($Al_2O_3$), zinc selenide (ZnSe), diamond (C), aluminum nitride (AlN), aluminum gallium nitride (AlGaN), and aluminum gallium indium nitride (AlGaInN). Additionally, the mole fractions of each of the given elements of the quarter wave plate emitter layer 130 may also change. For example, depending on the exact wavelength of light to be emitted, different mole fractions may be used. In the example embodiment of FIG. 1A, for instance, the quarter wave plate emitter layer 130 comprises one set of mole fractions, wherein in another example embodiment, it might be different.

The thickness (t) of the quarter wave plate emitter layer 130 should be specifically chosen, such that it has the quarter wave plate properties discussed above. The thickness (t) of the quarter wave plate emitter layer 130, in accordance with this disclosure, should be based upon a birefringence of the quarter wave plate emitter layer 130, as well as a given wavelength of light to be emitted therefrom. For instance, in one example embodiment, the equation $$t = \frac{(2m+1)\lambda_0}{4\Delta n}$$

is used to select the thickness (t) of the quarter wave plate emitter layer 130. In this example embodiment, $\lambda_0$ is a desired wavelength of the light to be emitted therefrom, m is an integer, and $\Delta n$ is the birefringence of the material of the quarter wave plate emitter layer 130 for the given wavelength of light to be emitted, $\lambda_0$. It is known that LEDs typically emit a spectrum which is broader than a pure saturated color such as that emitted by a laser. Hence, $\lambda_0$ here corresponds with the emission spectrum peak as emitted by an LED.

Using the aforementioned equation, as well as the quarter wave plate emitter layer 130 comprising one specific mole fraction of AlGaInP, a thickness (t) of the quarter wave plate emitter layer 130 for various different emitted colors, in one example embodiment, should be about:

| | | |
|---|---|---|
| Red | $t_{m-0}$ = 7.94 μm | $t_{m-1}$ = 23.81 μm |
| Green | $t_{m-0}$ = 3.38 μm | $t_{m-1}$ = 10.13 μm |
| Blue | $t_{m-0}$ = 1.88 μm | $t_{m-1}$ = 5.63 μm |

Figure 2:
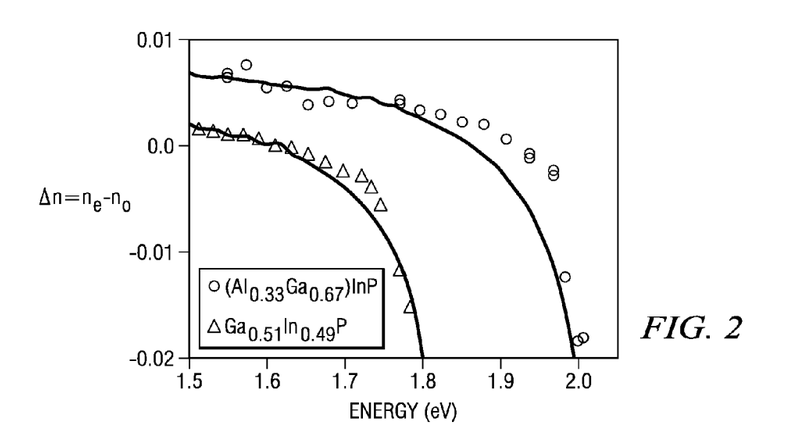
FIG. 2 illustrates a chart for the birefringence of a quarter wave plate emitter layer for two example semiconductor materials, taken from Wirth et al, Phys. Rev. B, 1997.

The values of $\Delta n$ may be obtained or extrapolated from various charts, in this embodiment the chart 200 of FIG. 2. These values would generally differ for different materials, as well as different values for the wavelength of light to be emitted. Those skilled in the art, given the teachings herein, would understand how to calculate the different thicknesses (t) for the different materials that might comprise the quarter wave plate emitter layer 130, particularly when provided a dispersion of birefringence graph for a given material.

The quarter wave plate emitter layer 130 has an extraordinary axis oriented in the plane of the substrate 110. When crystalline materials with three spatial dimensions have the same refractive index along two dimensions, and a different refractive index along the third dimension, they are called Birefringent materials. The common refractive index along the two spatial dimensions is called the ordinary index, denoted as $n_o$. The refractive index along the third unique axis is called the extra-ordinary index, denoted as $n_e$. When the extraordinary index, $n_e$, is larger than the ordinary index, $n_o$, the extra-ordinary axis (index) is called the slow axis (index) and the ordinary axis (index) is called the fast axis (index). The terms are named as such due to the fact that the larger index results in light traveling slower than in the smaller index dimension. Hence the terms "slow axis" and "fast axis". The difference $n_e - n_o$ is called birefringence, denoted as $\Delta n$.

Positioned over the quarter wave plate emitter layer 130 in the embodiment of FIG. 1A is a transmissive/reflective polarization layer 140. The transmissive/reflective polarization layer 140, as the name indicates, has both transmissive and reflective properties, depending on the polarization state of the light contacting it. This is in contrast to a transmissive/absorptive polarization layer, which would have transmissive and absorptive properties. The transmissive/reflective polarization layer 140 is in optical contact with the quarter wave plate emitter layer 130. In one example embodiment, the transmissive/reflective polarization layer 140 is located directly on the quarter wave plate emitter layer 130, as opposed to having one or more intervening layers (e.g., such as another quarter wave plate material).

While the transmissive/reflective polarization layer 140 is depicted generically, it is intended to comprise polarizers with multiple components such as a multilayer optical stack, an example of which is a Dual Brightness Enhancement Film (DBEF) sold by 3M Company. The transmissive/reflective polarization layer 140 may also comprise a multitude of individual conductive stripes, as are present in wiregrid polarizers. Optionally, the transmissive/reflective polarization layer 140 can also be covered with a protective coating. Suitable protective coatings include ceramics, glasses, polymers, and various anti-reflective (AR) coatings, among others.

The transmissive/reflective polarization layer 140 has a transmission direction. In the configuration of FIG. 1A, this transmission direction is oriented at about 45 degrees with respect to the extra-ordinary axis of the quarter wave plate emitter layer 130.

The transmissive/reflective polarization layer 140 transmits a first polarization state and not only blocks but also reflects a second polarization state orthogonal to the first state, both for normally incident light and obliquely incident light. "Orthogonal" in this regard, used in reference to polarization states, is not intended to be limited to linear polarization states that differ by 90 degrees, but also encompasses other mathematically independent polarization states such as, for example, left-circular versus right-circular polarization states.

When randomly polarized light is emitted by layer 130, and reaches layer 140, a portion of this randomly polarized light that is oriented along the transmission axis of the transmissive/reflective polarization layer 140 gets transmitted by the layer 140. The portion of this light that gets reflected by the layer 140, traverses the layer 130 downwards and becomes circularly polarized. When reflected by the reflective layer 120, this circularly polarized light changes handedness. When this light traverses the layer 140 in the second instance upwards, it becomes linearly polarized along a direction that is parallel to the transmission axis of the transmissive/reflective polarization layer 140, and hence is allowed through the layer 140. Note that the light that got transmitted in the first instance and the light that underwent recycling are both polarized along the same direction. Hence this LED emits substantially polarized light.

In cases where the emitted wavelength is different from the peak emission wavelength, $\lambda_0$, the quarter wave plate emitter layer 130 would act as a phase plate where it will cause a photon transmitting there through to be, in most cases, elliptically polarized. This will result in more than one recycling bounces needed for some photons and will hence slightly decrease the emission efficiency of the polarized LED at wavelengths that are slightly offset from the peak emission wavelength, $\lambda_0$.

Figure 1B:
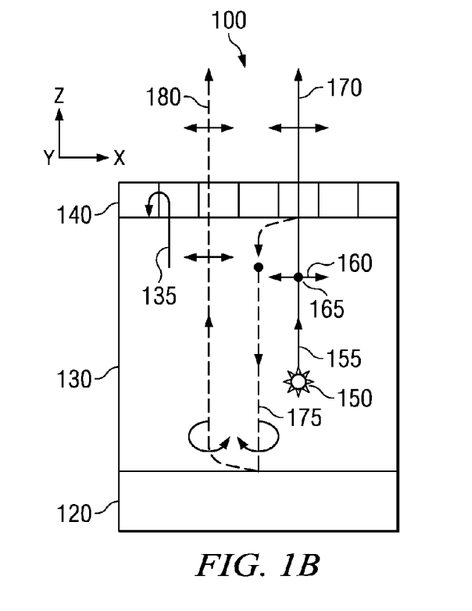
FIG. 1B illustrates an exploded view of the LED of FIG. 1A, for example as it is emitting a light ray.

FIG. 1B illustrates an exploded view of the LED 100 of FIG. 1A, for example as it is emitting a light ray 155. The light ray 155 shown in FIG. 1B is being emitted by a localized source 150 within LED 100. The localized source 150 represents an infinitesimal volume within the active area of the LED 100, and it emits light of all polarizations. In relation to a selected x-y-z reference frame, the source 150 emits both linear p-polarized light, whose electric field vector is parallel to the x axis, shown as a transverse double-sided arrow 160 on the light ray 155, and s-polarized light, whose electric field vector is parallel to the y axis, shown as a dot 165 on the light ray 155.

Light ray 155, in the example embodiment, is emitted in a direction normal (i.e., orthogonal) to the quarter wave plate emitter layer surface 135. When the light ray 155 encounters the transmissive/reflective polarization layer 140, one polarization of the light ray is transmitted and the other is reflected. In the example embodiment of FIG. 1B, the p-polarized light 170 is transmitted and the s-polarized light 175 is reflected.

The s-polarized light 175 that is reflected, then passes back through the thickness (t) of the quarter wave plate emitter layer 130. Because the reflected s-polarized light 175 is reflected back through the quarter wave plate emitter layer 130, its polarization is reversed. Accordingly, p-polarized light 180 reflects from the reflective layer 120 back toward the transmissive/reflective polarization layer 140, wherein because of its new polarization state, it is transmitted.

The combination of reflecting (e.g., at the transmissive/reflective polarization layer 140) light of the unwanted polarization state, recycling light within the LED 100, and converting at least some of the unwanted polarization state light to the desired polarization state, enhances both the luminous output and the brightness of the LED package with regard to light of the desired (first) polarization state. Moreover, if absorptive and scattering losses within the LED die are improved, the brightness of the LED package is improved even more.

Figure 3:
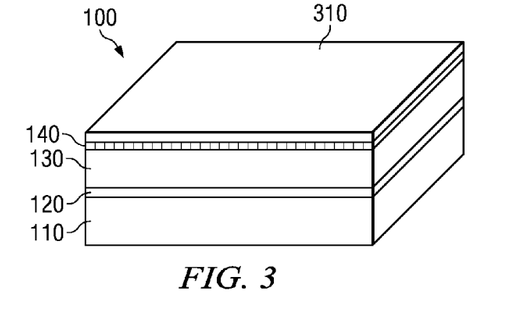
FIG. 3 illustrates the LED of FIG. 1A with an optional switchable polarization layer located over the transmissive/reflective polarization layer.

FIG. 3 illustrates the LED 100 of FIG. 1A with an optional switchable polarization layer 310 located over the transmissive/reflective polarization layer 140. The switchable polarization layer 310, in accordance with the disclosure, is configured to actively switch the polarization of a light beam exiting the transmissive/reflective polarization layer 140. In one example embodiment, the switchable polarization layer 310 is switched by applying (or removing) a voltage across opposing surfaces thereof.

The switchable polarization layer 310, in accordance with the disclosure, may comprise any known or hereafter discovered material capable of actively switching the polarization of a beam of light passing there through. In one example embodiment, the switchable polarization layer comprises a Liquid Crystal wave plate such a Twisted Nematic LC, or Homogeneously aligned LC, or Homeotropically aligned LC, or Ferroelectric LC, or Discotic LC wave plate. In yet another example embodiment, the switchable polarization layer comprises bulk electro-optic crystal based wave plates with appropriate electrodes for polarization switching, acousto-optic crystal based wave plates with appropriate acoustic transducers, or another similar material. The switchable polarization layer may be either a linearly switchable polarization layer or a circularly switchable polarization layer.

In one embodiment, the switchable polarization layer is a switchable half wave plate. In this embodiment, an extra-ordinary axis of the switchable half wave plate may be oriented at about 45 degrees with respect to the transmission direction of the transmissive/reflective polarization layer 140. This scenario might be used when the switchable half wave plate is a switchable linear half wave plate. In another embodiment, the switchable polarization layer is a switchable quarter wave plate. In this embodiment, an extra-ordinary axis of the switchable quarter wave plate may be switched between two states that are in a plane thereof, but at about 90 degrees apart.

A polarized LED manufactured in accordance with this disclosure has certain benefits over polarized LEDs that may currently exist. For example, a polarized LED manufactured according to this disclosure combines the functions of an emitter and a quarter wave plate into a single material layer. Heretofore, it was not recognized that a combined quarter wave plate emitter could be used to manufacture a polarized LED. Additionally, because these functions are combined, and thus a separate quarter wave plate layer is not required, standard semiconductor manufacturing processes may be used to form a significant portion of the polarized LED. For example, each of the reflective layer, quarter wave plate emitter layer and transmissive/reflective polarization layer may be formed within a deposition tool without breaking vacuum, thus saving time, money and complexity, as well as improving the efficiency of the device in certain instances.

Figure 4:
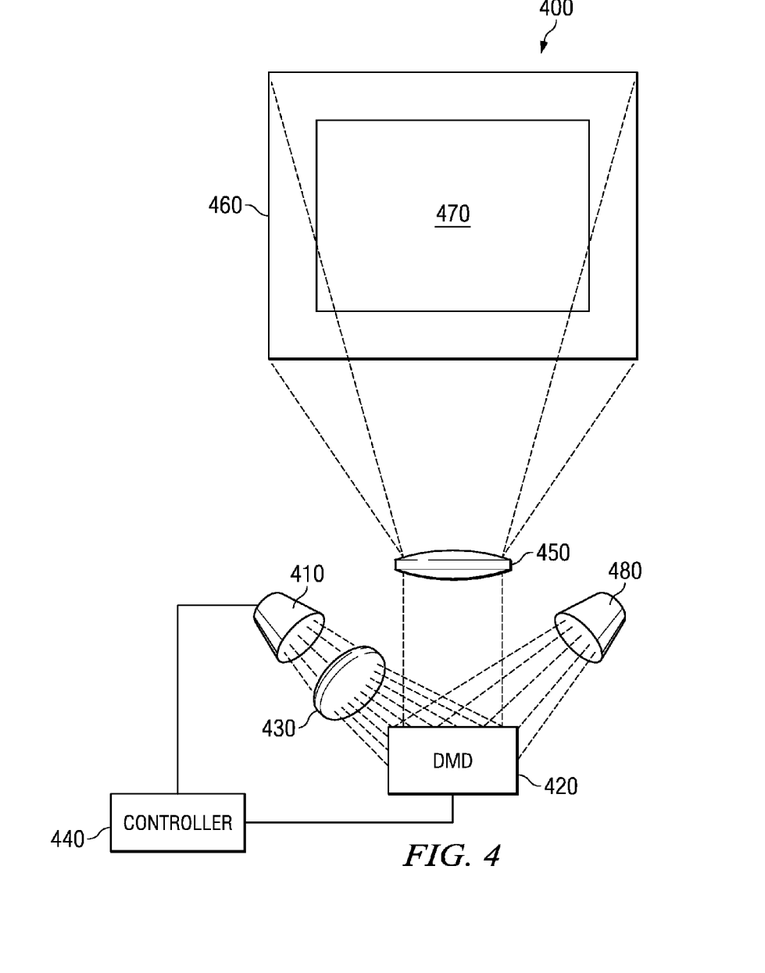
FIG. 4 illustrates a display system manufactured in accordance with this disclosure.

FIG. 4 illustrates a display system 400 manufactured in accordance with this disclosure. In the projection display system illustrated in FIG. 4, illumination is provided from a light source 410. The light source 410, in accordance with one embodiment, includes an array of polarized LEDs, for example such as discussed in detail above. The light source 410, as is illustrated, is focused onto the surface of a spatial light modulator (SLM) by means of a condenser lens 430 placed in the path of the light. In the example embodiment of FIG. 4, the SLM includes one or more DMDs 420. Nevertheless, the SLM could also include an LCoS projection device or LCD projection device, among others. An electronic controller 440 is connected to both the DMDs 420 and the light source 410 and used to modulate the DMDs 420 and to control the light source 410.

For all DMD pixels in the ON state, the incoming light beam is reflected towards a projection lens 450, where it is magnified and projected on to a viewing screen 460 to form an image 470. On the other hand, DMD pixels in the OFF state, as well as any stray light reflected from various near flat surfaces on and around the DMD, are reflected into a light trap 480 and discarded.

A display system, such as the display system 400, may be used to display 3-D images. In one embodiment wherein the polarized LEDs contained within the display system 400 are actively switchable, the display system could further include passive goggles to enjoy the 3-D viewing experience. In those situations wherein the LEDs are not actively switchable, active goggles may be used to enjoy the 3-D viewing experience.

Figure 5:
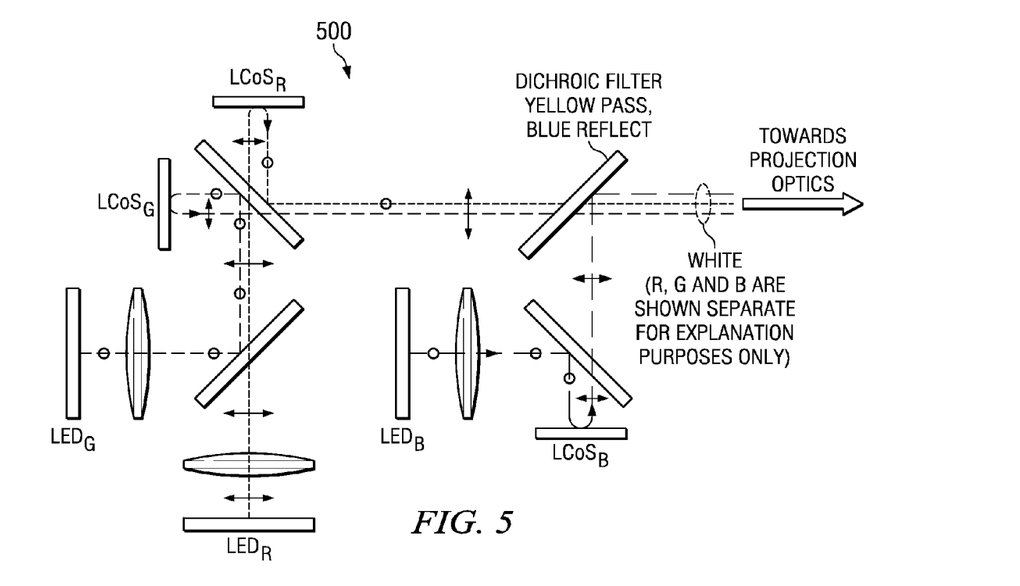
FIG. 5 illustrates an LCoS projection device (e.g., an LCoS SLM) configured to use polarized LEDs.

FIG. 5 illustrates an LCoS projection device 500 (e.g., an LCoS SLM) configured to use polarized LEDs. In the example embodiment shown, one polarized LED is used for illuminating one LCoS panel. For example, a Blue polarized LED, labeled $LED_B$, is used to illuminate the Blue LCoS panel, labeled, $LCoS_B$. A wiregrid polarizer is used to separate the illumination and the projection light on the LCoS panel. Illumination polarized light from the $LED_B$ has a polarization shown by a dot (along y axis). This polarization is reflected by the wiregrid polarizer towards the $LCoS_B$ panel. For an example pixel that is in the off-state, this incoming light polarization stays unchanged, and hence after traversing the $LCoS_B$ panel, reflects back towards the $LED_B$. If this pixel is in the on-state, then the outgoing light polarization gets converted to the orthogonal state after traversing the $LCoS_B$ panel. The wiregrid polarizer then allows this polarization (along x axis) to be transmitted towards a color filter, that reflects it towards the projection lens. A total of at least three such polarized LEDs may be used for making a white color display. The operation principle of the other two or more colors will be similar to the method just described.

Although not shown here, other illumination optics for condensing and homogenizing the LED light onto the LCoS panel may need to be used in an eventual system. Also, other color splitting/combining schemes can be utilized that may be slightly different in operation but essentially similar in principle, e.g.; yellow reflect and blue transmit, etc. Note that there is generally no need for an external polarization recycling scheme such as polarization beam splitter cube array as used in typical LCoS projection engines that use unpolarized sources such as arc lamps. An LCoS projection device, such as the LCoS projection device 500, might be used in place of the DMD 420 of FIG. 4.

Figure 6:
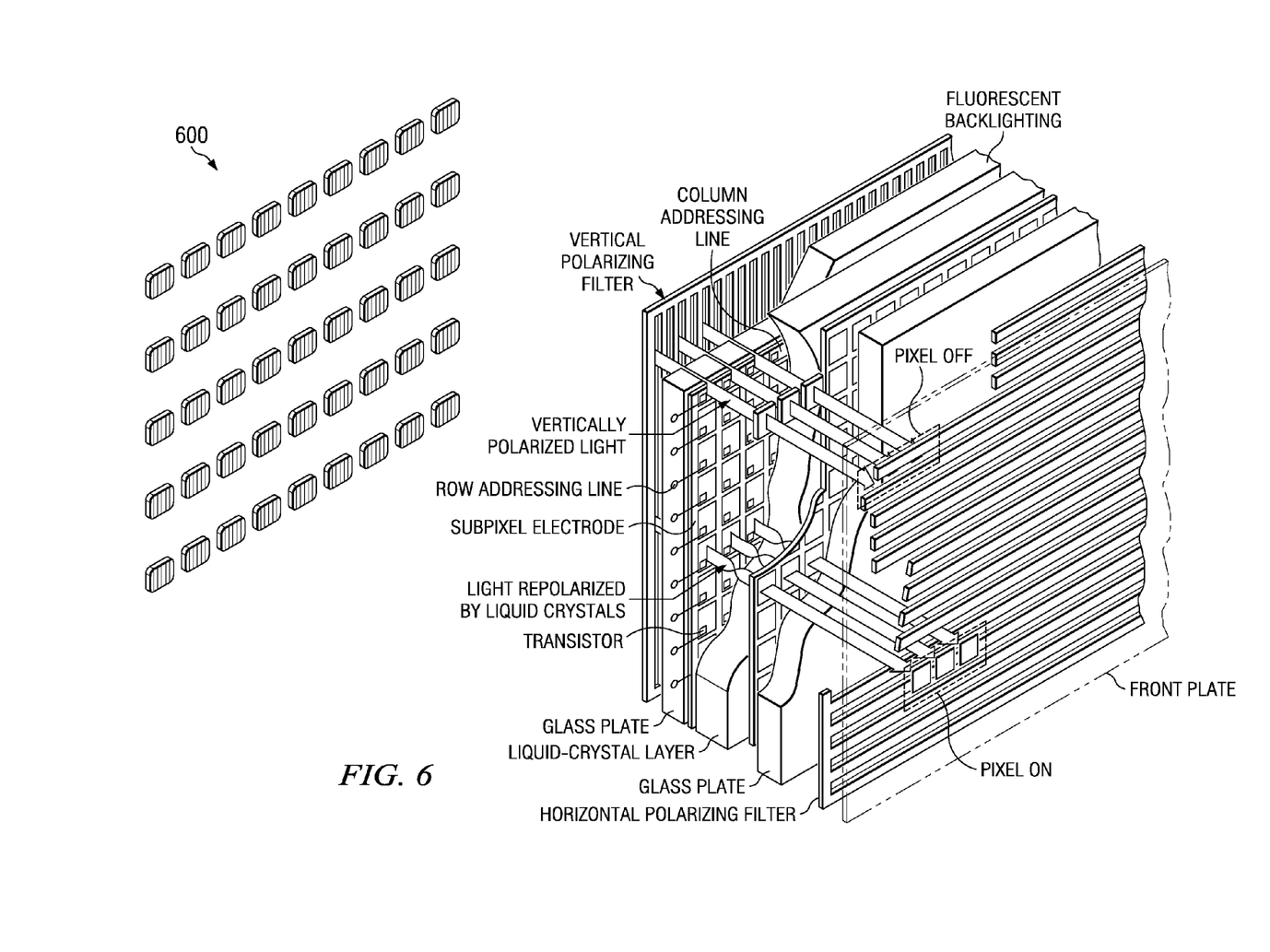
FIG. 6 illustrates the use of polarized LEDs as backlighting for a flat panel LCD display.

FIG. 6 illustrates the use of polarized LEDs as backlighting for a flat panel LCD display. Conventional flat panel LCD displays use unpolarized light sources. This means that external polarization recycling films have to be incorporated into the backlight unit in order to convert the unwanted polarization into a desired polarization direction. This improves the panel optical efficiency by trading off cost and complexity. Use of a polarized LED array simplifies the optical system by removing the need for the polarization recycling films. This should help reduce cost and complexity and at the same time improve the transmission efficiency of the panel. Moreover, arrays of red, green and blue LEDs can be turned on in a time sequential fashion to enable the use of a single pixel for the three colors, hence reducing the number of total pixels needed for making a LCD display by a factor of ⅔.

Figure 7:
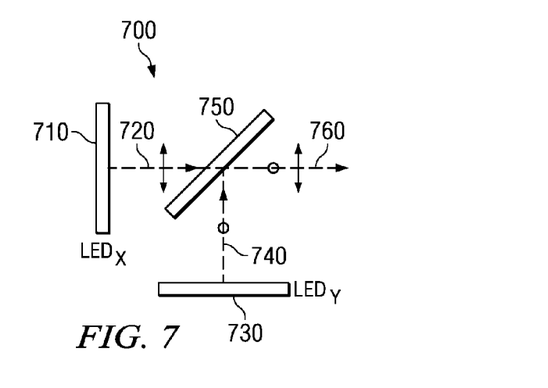
FIG. 7 illustrates a method for polarization combining.

FIG. 7 illustrates an LED configuration 700 for combining orthogonally polarized LEDs. The LED configuration 700 includes a first p-polarized light LED 710 employed to provide p-polarized light 720, and a second s-polarized light LED 730 employed to provide s-polarized light 740. The p-polarized light LED 710 and the s-polarized light LED 730, in general, may comprise a structure similar to the LED 100 of FIG. 1A. In the embodiment of FIG. 7, an optical combiner 750, such as the wiregrid polarizer or another appropriate element, is appropriately placed to combine the p-polarized light 720 and the s-polarized light 740 into a combined p/s polarized light 760.

An LED configuration, such as the LED configuration 700 designed to provide the p/s polarized light 760, may be used to increase the brightness of an existing optical system without increasing the etendue significantly. For example, a similar LED configuration can be used in a 3-D display system wherein one LED (e.g., the p-polarized light LED 710) is used for the right eye sub frame and the other LED (e.g., the s-polarized light LED 730) is used for the left eye sub frame. Not only will such a system experience increased brightness without significantly increased etendue, but it will also reduce the dark time associated with slow speed LC active shutters or polarization switches by enabling the use of passive absorptive polarizer based shutters.

Those skilled in the art to which the disclosure relates will appreciate that other and further additions, deletions, substitutions and modifications may be made to the described embodiments without departing from the scope of the disclosure.

What is claimed is:

1. A light emitting diode, comprising:
   a reflective layer located over a substrate;
   a quarter wave plate emitter layer located over the reflective layer, the quarter wave plate emitter layer being substantially crystalline in nature, wherein an extra-ordinary axis of the quarter wave plate emitter layer is located in a plane thereof;
   a transmissive/reflective polarization layer located over the quarter wave plate emitter layer, wherein a transmission direction of the transmissive/reflective polarization layer is oriented at about 45 degrees with respect to the extra-ordinary axis of the quarter wave plate emitter layer; and
   a switchable polarization layer located over the transmissive/reflective polarization layer.

2. The light emitting diode as recited in claim 1, wherein the switchable polarization layer is a switchable linear polarization layer configured to switch an input polarization between two linear polarizations at an output or a switchable circular polarization layer configured to switch an input polarization between two circular polarizations at the output.

3. The light emitting diode as recited in claim 1, wherein the transmissive/reflective polarization layer is a wiregrid polarizer layer.

4. The light emitting diode as recited in claim 1, wherein the transmissive/reflective polarization layer is located directly on the quarter wave plate emitter layer.

5. The light emitting diode as recited in claim 1, wherein the reflective layer is a reflective electrode layer.

6. The light emitting diode as recited in claim 1, wherein the light emitting diode is configured to provide polarized illumination, and further wherein a spatial light modulator is placed to receive the polarized illumination and display an image.

7. The light emitting diode as recited in claim 6, wherein the light emitting diode is one of an array of polarized light emitting diodes configured to provide the polarized illumination and further wherein the spatial light modulator is an array of micromirror devices optically coupled to the array of polarized light emitting diodes, wherein the array of micromirror devices is configured to reflect the illumination through projection optics to display the image.

8. The light emitting diode as recited in claim 6, wherein the light emitting diode is one of an array of polarized light emitting diodes configured to provide the illumination, and further wherein the spatial light modulator is an array of liquid crystals optically coupled to the array of polarized light emitting diodes, wherein the array of liquid crystals is configured to reflect or transmit the illumination through projection optics to display the image.

9. The display system as recited in claim 8, wherein the array of liquid crystals forms at least a portion of an LCD projection display or LCoS projection display.

10. The display system as recited in claim 6, wherein the light emitting diode provides an amount of backlighting for a flat panel LCD display.

11. A method for manufacturing a light emitting diode, comprising:
    forming a reflective layer over a substrate;
    forming a homogeneous quarter wave plate emitter layer having a thickness (t) over the reflective layer, wherein the thickness (t) is chosen based upon a birefringence of the quarter wave plate emitter layer and a given wavelength of light to be emitted there from, and further wherein an extra-ordinary axis of the quarter wave plate emitter layer is located in a plane thereof;
    forming a transmissive/reflective polarization layer over the quarter wave plate emitter layer, such that a transmission direction of the transmissive/reflective polarization layer is oriented at about 45 degrees with respect to the extra-ordinary axis of the quarter wave plate emitter layer; and
    forming a switchable half wave plate over the transmissive/reflective polarization layer, wherein an extra-ordinary axis of the switchable half wave plate is oriented at about 45 degrees with respect to the transmission direction of the transmissive/reflective polarization layer.

12. The method as recited in claim 11, wherein one or more layers interpose the transmissive/reflective polarization layer and the quarter wave plate emitter layer.

13. The method as recited in claim 11, wherein the thickness (t) of the quarter wave plate emitter layer is selected using the equation $$t = \frac{(2m+1)\lambda_0}{4\Delta n},$$

wherein $\lambda_0$ is a desired wavelength of the light, m is an integer, and $\Delta n$ is a birefringence of the quarter wave plate emitter layer at the desired wavelength of the light, $\lambda_0$.

14. The method as recited in claim 11, wherein forming the reflective layer, forming the quarter wave plate emitter layer, and forming the transmissive/reflective polarization layer occur in a deposition tool without breaking vacuum.

15. A method for manufacturing a light emitting diode, comprising:
   forming a reflective layer over a substrate;
   forming a homogeneous quarter wave plate emitter layer having a thickness (t) over the reflective layer, wherein the thickness (t) is chosen based upon a birefringence of the quarter wave plate emitter layer and a given wavelength of light to be emitted there from, and further wherein an extra-ordinary axis of the quarter wave plate emitter layer is located in a plane thereof;
   forming a transmissive/reflective polarization layer over the quarter wave plate emitter layer, such that a transmission direction of the transmissive/reflective polarization layer is oriented at about 45 degrees with respect to the extra-ordinary axis of the quarter wave plate emitter layer; and
   forming a switchable quarter wave plate over the transmissive/reflective polarization layer, wherein an extra-ordinary axis of the switchable quarter wave plate can be switched between two states that are in a plane of the switchable polarization layer, but that are about 90 degrees apart.

* * * * *